(12) United States Patent
Nozawa et al.

(10) Patent No.: US 8,614,035 B2
(45) Date of Patent: Dec. 24, 2013

(54) PHASE SHIFT MASK BLANK, PHASE SHIFT MASK, AND METHOD FOR MANUFACTURING PHASE SHIFT MASK BLANK

(75) Inventors: Osamu Nozawa, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 13 days.

(21) Appl. No.: 13/491,957

(22) Filed: Jun. 8, 2012

(65) Prior Publication Data

US 2012/0251929 A1  Oct. 4, 2012

Related U.S. Application Data

(62) Division of application No. 13/072,571, filed on Mar. 25, 2011, now Pat. No. 8,216,747, which is a division of application No. 12/489,866, filed on Jun. 23, 2009, now Pat. No. 7,935,461.

(60) Provisional application No. 61/075,565, filed on Jun. 25, 2008.

(51) Int. Cl.
*G03F 1/32* (2012.01)

(52) U.S. Cl.
USPC ............................................................ 430/5

(58) Field of Classification Search
USPC .................... 430/5, 30; 378/35; 428/428, 430
See application file for complete search history.

(56) References Cited

U.S. PATENT DOCUMENTS 7,060,394 B2   6/2006  Shiota et al.

FOREIGN PATENT DOCUMENTS

JP   2003-280168 A   10/2003
JP   2006-078953 A    3/2006

*Primary Examiner* — Stephen Rosasco
(74) *Attorney, Agent, or Firm* — Sughrue Mion, PLLC

(57) ABSTRACT

A phase shift mask blank having, on a transparent substrate, a phase shift film including, as main components, a metal, silicon (Si) and nitrogen (N), having optical characteristics of a transmittance of equal to or greater than 9% and equal to or less than 30% with respect to a wavelength of the ArF excimer laser beam and a phase difference of equal to or greater than 150° and less than 180°, and a light-shielding film formed on the phase shift film. A thickness of the phase shift film is equal to or less than 80 nm, a refractive index (n) with respect to the wavelength of the ArF excimer laser beam is equal to or greater than 2.3, and an extinction coefficient (k) is equal to or greater than 0.28.

14 Claims, 3 Drawing Sheets

PHASE SHIFT MASK BLANK, PHASE SHIFT MASK, AND METHOD FOR MANUFACTURING PHASE SHIFT MASK BLANK

This is a continuation of U.S. Application No. 13/072,571, filed on Mar. 25, 2011, which is a divisional of U.S. application Ser. No. 12/489,866, filed Jun. 24, 2009, which issued as U.S. Pat. No. 7,935,461 on May 3, 2011, which claims priority from 61/075,565, filed Jun. 25, 2008. The present invention relates to a phase shift mask blank, a phase shift mask, and a method for manufacturing a phase shift mask blank.

FIELD OF THE INVENTION

Description of the Related Art

The advantages of increasing the degree of integration of semiconductor devices and the like include improvement of performance and functions (high-speed operation or reduced power consumption etc.) and cost reduction, and miniaturization of circuit patterns of semiconductor devices has been accelerated. Lithography is a technique that aids in miniaturizing the circuit patterns of semiconductor devices, and transfer masks that are used for transferring circuit patterns have occupied, together with exposure devices and resist materials, a highly important place.

Development of semiconductor devices of a semiconductor device design rule of 32 inn node and 22 nm node has been advances in recent years. A minimum line width formed in such semiconductor devices corresponds to ⅕ to ⅙ the wavelength (X: 193.4 nm) of exposure light of an ArF excimer laser.

In particular, semiconductor devices of a 32 nm node generation and beyond are difficult to manufacture by using conventional phase shift methods, resolution enhancement technology (RET), such as the oblique illumination method and pupil filter method, and optical proximity correction (OPC) technology etc., and an hyper-NA technology (immersion lithography and immersion exposure) or a double exposure method (double patterning) etc. became necessary.

The phase shift method is a technique that increases the resolution of a transfer pattern by generating a predetermined phase difference (for example, from 160° to 200°) with exposure light that is transmitted through a phase shift portion and using the light interference.

In the phase shift method, a halftone phase shift mask that includes a phase shift mask having an extremely high resolution and a transmittance of equal to or greater than 9%, preferably a transmittance of equal to or greater than 10% and up to 30% with respect to the exposure light has recently attracted attention as a phase shift mask that can be applied to semiconductor devices of a 32 nm node generation and beyond.

Two types of such halftone phase shift masks have been suggested.

One of them is a phase shift mask described in Japanese Patent Application Laid-open No. 2006-78953. This is the so-called "engraved phase shift mask" produced by forming a phase shift film with a transmittance of 9 to 15% and a phase difference of 110 to 135° on a transparent substrate, then patterning the phase shift film, etching the transparent substrate by using the patterned phase shift film as a mask, and engraving the substrate till the transparent substrate and the phase shift film have a phase difference with respect to the transmitted exposure light of 180°.

Another phase-shift mask is described in Japanese Patent Application Laid-open No. 2003-280168. This is the so-called "two-layer phase shift mask" having formed therein a phase shift film prepared by successively laminating a transmittance control layer and a phase difference control layer on a transparent substrate, wherein the transmittance of the light transmitted by the phase shift film is 20 to 40% and the phase difference is 180°.

RELATED ART LITERATURE

Patent Literature

Patent Literature 1: Japanese Patent Application Laid-open No. 2006-78953
Patent Literature 2: Japanese Patent Application Laid-open No. 2003-280168

SUMMARY OF THE INVENTION

Problems to be Solved by the Invention

The problems associated with the engraved phase shift mask, which is the former of the above-described two masks, are that the transparent substrate is difficult to control accurately so as to obtain a phase difference of 180° and that defects of the engraved portions of the substrate are difficult to repair.

In the two-layer phase shift mask, which is the latter of the two masks, a material having etching selectivity with respect to the transparent substrate and phase difference control layer is usually used for the transmittance control layer in order to control the phase difference accurately. Therefore, when the phase shift mask is produced, the number of etching cycles increases and the film thickness necessary to provide a phase difference of 180° is equal to or greater than 100 nm. The resultant problem is that the requirements relating to pattern collapse and pattern accuracy are difficult to meet in the semiconductor devices of a 32 nm node generation and beyond for which an OPC pattern with a minimum pattern width of equal to or less than 50 nm is indispensable.

Accordingly, there is a demand for a phase shift mask that makes it possible to decrease the film thickness of the phase shift film, can satisfy the requirement relating to pattern accuracy, without collapsing the OPC pattern, and enables control of optical characteristics and pattern defect inspection, and also for a phase shift mask blank as an original plate for such a phase shift mask.

Further, the phase difference of the conventional phase shift masks has been usually required to be set to 180° to demonstrate a maximum phase shift effect.

Means for Solving the Problems

The inventors have found that under exposure conditions of immersion lithography that are necessary for semiconductor devices of a 32 nm node generation and beyond, the phase difference of 180° is not necessary and have found that decreasing the thickness of the phase shift film by setting the phase difference to less than 180° has a significant advantage of improving the cross-sectional shape of a pattern such as an OPC pattern or a circuit pattern.

Accordingly, the inventors have decreased the thickness of the phase shift film by setting the phase difference to a value equal to or greater than 150° and less than 180° that makes it possible to increase sufficiently the resolution provided by the phase shift effect and obtain good transfer pattern characteristic, even without engraving the substrate.

The inventors also investigated the decrease in thickness of the phase shift film and reduced the molybdenum (Mo) content to the total content of molybdenum+silicon (Mo+Si) to a limit at which a molybdenum silicide (MoSi) target of good quality can be produced with good stability. Further, in order to increase the refractive index that is effective for decreasing the thickness, the flow rate of gas including nitrogen (N) during film formation was increased and the content of N in the phase shift film was raised to a maximum possible level. In addition, in a case where the transmittance with respect to the exposure light was insufficient, an oxygen-containing gas was used by limiting the flow rate of the oxygen-containing gas during film formation to a minimum necessary level, thereby reducing as much as possible the content of oxygen (0) in the phase shift film.

A. First Aspect of the Present Invention

The present invention provides the below-described phase shift mask blank etc. as a phase shift mask blank etc. of the first aspect.

[A1]

A phase shift mask blank that is an original plate for a phase shift mask that is used with a semiconductor design rule of 32 nm node and beyond and exposed by an ArF excimer laser beam, including on a transparent substrate: phase shift film including, as main components, a metal, silicon (Si) and nitrogen (N), having optical characteristics of a transmittance of equal to or greater than 9% and equal to or less than 30% with respect to a wavelength of the ArF excimer laser beam and a phase difference of equal to or greater than 150° and less than 180'; and a light-shielding film (an opaque film) formed on the phase shift film, wherein a thickness of the phase shift film is equal to or less than 80 nm, and a refractive index (n) with respect to the wavelength of the ArF excimer laser beam is equal to or greater than 2.3, and an extinction coefficient (k) is equal to or greater than 0.28.

[A2]

The phase shift mask blank as described in [A1], wherein the phase shift film includes the metal, silicon (Si), and nitrogen (N), and a value of (atomic concentration of the metal)/(atomic concentration of the metal+atomic concentration of Si) is 0.06 to 0.13 and the content of N is equal to or greater than 35 atomic % and equal to or less than 55 atomic %.

In a case where oxygen (0) is contained in the phase shift film of the phase shift mask blank, it is preferred that the content of 0 be equal to or less than 20 atomic %.

[A3]

The phase shift mask blank as described in [A1], wherein the light-shielding film has a laminated structure having a light-shielding layer and a surface antireflection layer in this order from the phase shift film side and has a film thickness such that an optical density with respect to the wavelength of the ArF excimer laser beam produced by the phase shift film and the light-shielding film is equal to or greater than 2.8.

[A4]

The phase shift mask blank as described in [A3], wherein a thickness of the light-shielding film is equal to or less than 60 nm

[A5]

The phase shift mask blank as described in [A4], wherein an etching mask film of different etching selectivity is formed on the light-shielding film or the light-shielding layer.

As used herein, the expression "main components" mean that the components are included at a content of at least equal to or greater than 70 atomic %.

Unless explicitly stated otherwise, as used herein, the content of each element contained in the phase shift film and the like is based on measurement results obtained by Auger electron spectroscopy.

With consideration for all the factors including the phase difference, transmittance, and thickness of the above-described phase shift film, the most preferred phase shift mask blank according to [A1] has on a transparent substrate, a phase shift film including, as main components, a metal, silicon (Si) and nitrogen (N), having optical characteristics of a transmittance of equal to or greater than 10% and equal to or less than 20% with respect to a wavelength of the ArF excimer laser beam and a phase difference of equal to or greater than 150° and equal to or less than 170°, and a light-shielding film formed on the phase shift film, wherein a thickness of the phase shift film is equal to or less than 65 nm; and a refractive index (n) with respect to the wavelength of the ArF excimer laser beam is equal to or greater than 2.3 and equal to or less than 2.6, and an extinction coefficient (k) is equal to or greater than 0.28 and equal to or less than 0.48.

In the phase shift mask blank according to [A3] and the below-described [B3], the light-shielding film formed on the phase shift film has a laminated structure including a light-shielding layer and a surface antireflection layer in this order from the phase shift film side and has a film thickness such that an optical density with respect to the wavelength of the ArF excimer laser beam produced by the phase shift film and the light-shielding film is equal to or greater than 2.8. Therefore, by using the phase shift mask blank according to [A3] or [B3], it is possible to produce, for example, a phase shift mask (tri-tone mask) in which a light-shielding film pattern 10 is further formed on a phase shift film pattern 20, as shown in (2) of FIG. 1, and to prevent pattern defects of a transferred substrate caused by the phase shift film pattern formed on the transfer region on the basis of light that has been transmitted through the phase shift film.

In the phase shift mask blank according to [A4] and the below-described [B4], a thickness of the light-shielding film is equal to or less than 60 nm. Therefore, the cross-sectional shape of the light-shielding film pattern is close to an orthogonal shape and a pattern accuracy that is required for the 32 nm node can be obtained. Therefore, the phase shift film pattern obtained by patterning that uses the light-shielding film pattern as a mask also can have the pattern accuracy required for the 32 nm node.

The phase shift mask blank according to [A5] and the below-described [B5] has a structure in which a film for an etching mask composed of an inorganic material having resistance to dry etching of the light-shielding film is laminated on the light-shielding film formed on the phase shift film and the thickness of the resist film to be formed on the film for an etching mask can be reduced. Therefore, a phase shift mask blank is obtained that is useful for forming a fine pattern and in which a loading effect is inhibited. The film for an etching mask may also have an antireflection function. Furthermore, the film for an etching mask may be from a material that can be peeled off when the phase shift film is etched.

In the phase shift mask blank of a preferred embodiment of the present invention, the phase shift film is from a molybdenum silicide (MoSi)-based material, and the material of the light-shielding film is preferably constituted by chromium or a chromium compound having an element such as oxygen (0), nitrogen (N), and carbon (C) added to chromium, having etching selectivity (etching resistance) with respect to etching of the phase shift film. The film for an etching mask is preferably constituted by a material including silicon (Si) that has etching selectivity (etching resistance) with respect to etching of the light-shielding film.

With the phase shift mask blank in which a film for an etching mask is formed on the light-shielding film of [A5] and the below-described [B5], when the film for an etching mask that includes silicon (Si) is patterned by dry etching using a fluorine-containing gas and a resist pattern as a mask, the damage of the resist pattern is small. Therefore, the thickness of the resist film formed on the film for an etching mask can be further reduced to a value equal to or less than 200 nm, and a thickness of equal to or less than 150 nm can be used. In this case, further miniaturization of the resist pattern can be realized.

B. Second Aspect of the Present Invention

It is generally difficult to confirm whether a phase shift film of high transmissivity is formed on a transparent substrate. In a process of manufacturing a phase shift mask blank, where visual observations or an automatic detection device determine that a phase shift film has not been formed on the transparent substrate, a mistake of forming the phase shift film the second time can be easily made.

Furthermore, reducing the molybdenum (Mo) content to a total content of molybdenum+silicon (Mo+Si) to a limit at which a molybdenum silicide target can be stably produced can become an instability factor during film formation, cause defects in the phase shift film, and reduce the production yield.

Thus, a phase shift mask blank and a manufacturing method thereof are required that can enable high-yield stable production and can be produced without human errors even when the thickness of the high-transmittance phase shift film is reduced.

Accordingly, the present invention provides the below-described phase shift mask blank etc. as a phase shift mask blank etc. of the second aspect.

[B1]

A phase shift mask blank that is an original plate for a phase shift mask that is used with a semiconductor design rule of 32 nm node and beyond and exposed by an ArF excimer laser beam, including on a transparent substrate: a phase shift film including, as main components, a metal, silicon (Si) and nitrogen (N), having optical characteristics of a transmittance of equal to or greater than 9% and equal to or less than 30% with respect to a wavelength of the ArF excimer laser beam and a phase difference of equal to or greater than 150° and less than 180; and a light-shielding film formed on the phase shift film, wherein a thickness of the phase shift film is equal to or less than 80 nm, and an extinction coefficient (k) of the phase shift film with respect to light with a wavelength of 400 nm is greater than 0.03.

[B2]

The phase shift mask blank as described in [B1], wherein the phase shift film includes a metal, silicon (Si) and nitrogen (N), and a value of (atomic concentration of the metal)/(atomic concentration of the metal+atomic concentration of Si) is 0.06 to 0.13 and the content of N is equal to or greater than 35 atomic % and equal to or less than 55 atomic %.

In a case where the phase shift film of the phase shift mask blank includes oxygen (0), the content of 0 is preferably equal to or less than 20 atomic %.

[B3]

The phase shift mask blank as described in [B1], wherein the light-shielding film has a laminated structure including a light-shielding layer and a surface antireflection layer in this order from the phase shift film side and has a film thickness such that an optical density with respect to the wavelength of the ArF excimer laser beam produced by the phase shift film and the light-shielding film is equal to or greater than 2.8.

[B4]

The phase shift mask blank as described in [B3], wherein the thickness of the light-shielding film is equal to or less than 60 nm.

[B5]

The phase shift mask blank as described in [B4], wherein an etching mask film of different etching selectivity is formed on the light-shielding film or the light-shielding layer.

In the phase shift mask blank according to [B1], the extinction coefficient (k) is more than 0.03 with respect to light with a wavelength of 400 nm that can be sensed visually or by an automatic detection device for the purpose of recognizing the presence or the absence of a film even in a case of a thin film with a thickness of equal to or less than 80 nm that has a transmittance of the phase shift film of equal to or greater than 9% and equal to or less than 30%. Therefore, the presence or the absence of the film can be recognized from an end surface that is in an orthogonal relationship with the main surface of the transparent substrate where the phase shift film is formed. For example, in a case where the presence or the absence of the film is recognized visually, where the phase shift film has been formed, the recognition can be performed from the end surface of the transparent substrate by coloration with light brown color, light yellow brown color, or light yellow color. In a case where the phase shift film has not been formed, the end surface of the transparent substrate has a transparent color. Therefore, the presence or the absence of the film can be reliably recognized In a phase shift film having a metal, silicon (Si) and nitrogen (N) as the main components, the value of the extinction coefficient (k) generally decreases with the increase in wavelength. Therefore, the extinction coefficient (k) assumes a maximum value at a wavelength of 400 nm, which is a lower limit of a wavelength range of the visible light region. Therefore, in accordance with the present invention, a value of an extinction coefficient (k) at a wavelength of 400 nm is used as an indicator of possibility to distinguish the coloration of the phase shift film.

It is preferred that the extinction coefficient (k) of the phase shift film at a wavelength of 400 nm be equal to or greater than 0.04.

C. Third Aspect of the Present Invention

The present invention provides the below-described method etc. for manufacturing a phase shift mask blank as a phase shift mask blank etc. of the third aspect.

[C1]

A method for manufacturing a phase shift mask blank that is an original plate for a phase shift mask that is used with a semiconductor design rule of 32 nm node and beyond and exposed by an ArF excimer laser beam, the method including forming a phase shift film having molybdenum (Mo), silicon (Si) and nitrogen (N) as main components on a transparent substrate by reactive sputtering using a molybdenum silicide target including Mo and Si in an atmosphere including a nitrogen gas, wherein a content of molybdenum relative to a total content of Mo and Si contained in the molybdenum silicide target is equal to or greater than 2% and less than 5%, and a relative density is equal to or greater than 98%.

[C2]

The method for manufacturing a phase shift mask blank according to [C1], wherein the molybdenum silicide target includes boron (B) is equal to or greater than $10^{20}$ atm/cm3.

With the method for manufacturing a phase shift mask blank according to [C1], a content of molybdenum (Mo) relative to a total content of molybdenum (Mo) and silicon (Si) contained in the molybdenum silicide target that is used in the manufacturing process is equal to or greater than 2% and less than 5%. As a result, the content of oxygen (O) necessary to obtain a transmittance of the phase shift film of equal to or greater than 9% and equal to or less than 30% can be made less than 20% and a film thickness necessary to obtain a phase difference of the phase shift film of equal to or greater than 150° and less than 180° can be made equal to or less than 80 nm Therefore, the OPC pattern that is indispensable for the 32 nm node and beyond can be prevented from collapsing.

Since the relative density of the molybdenum silicide target is equal to or greater than 98%, a phase shift film can be formed with good stability even during reactive sputtering in an atmosphere including a nitrogen gas.

The relative density of the molybdenum silicide target can be calculated in the following manner.

Relative density=(Target density)/(Theoretic density)

Target density=(Target weight)/(Target volume)(g/cm3)

Theoretic density=$(Am \times Mm + As \times Ms) \times Dm \times Ds/(Am \times Mm \times Ds + As \times Ms \times Dm)$ Atomic amount of molybdenum (Mo): Am
Atomic amount of silicon (Si): As
Density of molybdenum (Mo): Dm (g/cm3)
Density of silicon (Si): Ds (g/cm3)
Ratio of molybdenum (Mo): Mm (atomic %)
Ratio of silicon (Si): Sm (atomic %)

With the method for manufacturing a phase shift mask blank according to [C2], since the content of boron (B) is equal to or greater than $10^{20}$ atm/cm$^3$, even when the ratio of molybdenum (Mo) in the molybdenum silicide target is as small as equal to or greater than 2% and less than 5%, abnormal discharge can be prevented and defects in the phase shift film can be inhibited even when reactive sputtering is carried out in an atmosphere including a nitrogen gas.

The composition of molybdenum (Mo) and silicon (Si) in the molybdenum silicide target are calculated based on the contents measured by a fluorescent X ray analysis method.

Effect of the Invention

According to the preferred aspects of the present invention, even in the OPC pattern that is indispensable for the semiconductor devices of 32 nm node generation and beyond, the pattern can be prevented from collapsing and the pattern accuracy requirement can be satisfied.

According to the preferred aspects of the present invention, the transmittance at a wavelength (257 nm) of a defect inspection apparatus is equal to or less than 60%, the reflectance at a wavelength (678 nm) of light that is used for etching end point detection when the phase shift film is patterned by etching is equal to or greater than 20%, and controllability of phase difference is improved. As a result, it is possible to provide a phase shift mask and a phase shift mask blank that can be inspected for defects and can be used in semiconductor devices of the 32 nm node generation and beyond.

EMBODIMENTS FOR CARRYING OUT THE INVENTION

1. Phase Shift Mask Blank

Figure 1:
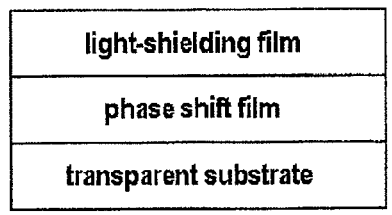
FIG. 1 is a schematic diagram illustrating a phase shift mask blank and a phase shift mask.

The phase shift mask blank in accordance with the present invention has a phase shift film and a light-shielding film on a transparent substrate. It is preferred that, as shown in (1) of FIG. 1, a phase shift film 2 be provided on a transparent substrate 3, and a light-shielding film 1 be provided on the phase shift film. The photomask blank in accordance with the present invention can be a photomask blank having a resist film formed thereon or a photomask blank having no resist film formed thereon.

The phase shift mask blank in accordance with the present invention is especially effective when used in immersion lithography.

1.1. Transparent Substrate

The transparent substrate is not particularly limited, provided that it is a substrate having transparency. For example, a synthetic quartz substrate, an aluminosilicate glass substrate, a calcium fluoride substrate, and a magnesium fluoride substrate can be used. Among them, a synthetic quartz substrate is preferred because it has high flatness and smoothness and enables high-accuracy pattern transfer, without distorting the transfer pattern, in a case where pattern transfer on a semiconductor substrate is performed by using the photomask.

1.2. Phase Shift Film

The phase shift film has a function of shifting a phase of exposure light and a function of substantially shielding the exposure light.

The composition of the phase shift film is not particularly limited, but it is preferred that the composition include at least one element selected from transition metals, such as molybdenum (Mo), tantalum (Ta), zirconium (Zr), and tungsten (W); and silicon (Si). With consideration for etching characteristic of the phase shift film, sputtering target quality, and film formation stability, it is preferred that the transition metal contained in the phase shift film be molybdenum. Examples of compositions of the phase shift film including molybdenum and silicon include MoSi, MoSiO, MoSiN, MoSiON, MoSiCO, MoSiCN, and MoSiCON.

The phase shift mask blank having the above-described properties can be obtained by setting, in the composition of the phase shift film, a value of (atomic concentration of the metal)/(atomic concentration of the metal+atomic concentration of silicon (Si)) that is calculated from measurement results based on Auger electron spectroscopy within a range of 0.06 to 0.13 and setting the content of nitrogen (N) to a value that is equal to or greater than 35 atomic % and equal to or less than 55 atomic %. Furthermore, in a case where oxygen (O) is contained in the phase shift film, it is preferred that the content of O calculated from the measurement results based on Auger electron spectroscopy be equal to or less than 20 atomic %.

In the composition of the phase shift film of the phase shift mask blank having the above-described properties, a value (R) of (atomic concentration of the metal)/(atomic concentration of the metal+atomic concentration of silicon (Si)) that is calculated from measurement results based on Rutherford Backscattering Spectrometry is preferably 0.01 to 0.08 and the content of nitrogen (N) is preferably equal to or greater than 45 atomic % and equal to or less than 65 atomic %.

The phase shift mask blank of the preferred aspect that has the phase shift film having the film composition satisfying the above-described conditions has optical characteristics such that the transmittance at a wavelength (257 nm) of a defect inspection apparatus is equal to or less than 60% and the reflectance at a wavelength (678 nm) of light that is used for etching end point detection when the phase shift film is patterned by etching is equal to or greater than 20%. Therefore, controllability of phase difference is improved and it is possible to manufacture a phase shift mask that can be inspected for defects and can be used in semiconductor devices of the 32 nm node generation and beyond.

Further, the wavelength of the defect inspection apparatus is not limited to 257 nm. Thus, the wavelength of the defect inspection apparatus can be close to that of ArF excimer laser beam, for example, 193 nm or 199 nm, or can be 364 nm.

In the phase shift mask blank in accordance with the present invention, the phase difference of the phase shift film is set to a phase difference of equal to or greater than 150° and less than 180° that makes it possible to increase sufficiently the resolution by the phase shift effect and obtain good transfer pattern characteristic, without engraving the substrate. Furthermore, for the phase shift film, it is preferred that the refractive index (n) with respect to the wavelength of the ArF excimer laser beam be equal to or greater than 2.3 and the extinction coefficient (k) be equal to or greater than 0.28. Where such features are used, a thin film with a thickness of equal to or less than 80 nm can be obtained and a pattern accuracy required for the 32 nm node can be obtained without collapsing the OPC pattern, even though the transmittance of the phase shift film of the phase shift mask blank in accordance with the present invention is equal to or greater than 9% and equal to or less than 30%.

As for the refractive index (n) and extinction coefficient (k) of the phase shift film of the phase shift mask blank in accordance with the present invention, it is preferred that the refractive index (n) be equal to or greater than 2.3 and equal to or less than 2.6 and the extinction coefficient (k) be equal to or greater than 0.28 and equal to or less than 0.48 at the wavelength of ArF excimer laser beam.

With consideration for resolution and transfer characteristic etc. of the transfer pattern, it is preferred that the transmittance of the phase shift film of the phase shift mask blank in accordance with the present invention be equal to or greater than 10% and equal to or less than 20%.

Furthermore, from the standpoint of reducing the thickness of the phase shift film, it is preferred that the phase difference of the phase shift film of the phase shift mask blank in accordance with the present invention be equal to or greater than 150° and equal to or less than 175°, more preferably equal to or greater than 150° and equal to or less than 170°. With consideration for a transfer characteristic, it is most preferred that the phase difference of the phase shift film be equal to or greater than 155° and equal to or less than 165°.

Further reducing the thickness of the phase shift film of the phase shift mask blank in accordance with the present invention upon selecting the transmittance and phase difference with consideration for resolution of transfer patterns and transfer characteristic etc. is greatly advantageous in terms of pattern cross-section characteristic of the OPC pattern and circuit pattern. Accordingly, the thickness of the phase shift film is preferably equal to or less than 75 nm, more preferably equal to or less than 70 nm, even more preferably equal to or less than 65 nm, and most preferably equal to or less than 60 nm.

In the photomask blank in accordance with the present invention, the phase shift film may be provided directly on the transparent substrate or may be provided indirectly, for example, with a seed layer being interposed between the transparent substrate and the phase shift film. The thickness of the phase shift film is preferably equal to or less than 80 nm, more preferably equal to or less than 65 nm.

1.3. Light-Shielding Film

The light-shielding film of the photomask blank in accordance with the present invention may have a multilayer structure composed of a plurality of layers or a monolayer structure composed of one layer. A light-shielding film composed of an upper layer, an intermediate layer, and a lower layer is an example of the light-shielding film having a multilayer structure.

The composition of the light-shielding film is not particularly limited. An exemplary composition includes a metal and at least one element selected from the group consisting of oxygen (0), carbon (C), and nitrogen (N). More specifically, in a case where the light-shielding film includes chromium (Cr), the preferred compositions include CrO (chromium oxide), CrON (chromium oxide nitride), CrOC (chromium oxide carbide), CrN (chromium nitride), CrC (chromium carbide), and CrOCN (chromium oxide nitride carbide).

As shown in (1) of FIG. 1, it is preferred that the light-shielding film in the phase shift mask blank in accordance with the present invention be directly provided on the phase shift film. The light-shielding film is typically left on a phase shift film pattern that has been formed on a non-transfer region, or a phase shift film pattern that has been formed on the transfer region in the phase shift mask fabrication process. Therefore, the thickness of the light-shielding film is adjusted so that the optical density (OD) at an exposure wavelength be equal to or greater than 2.5 in the laminated film of the phase shift film and light-shielding film. Further, the phase shift film pattern is formed by patterning with the light-shielding film pattern serving as a mask, and in the formation of the phase shift film pattern, it is desirable that the thickness of the light-shielding film be as small possible. Thus, it is preferred that the thickness of the light-shielding film be equal to or less than 60 nm, more preferably equal to or less than 55 nm.

2. Method for Manufacturing Phase Shift Mask Blank

The phase shift mask blank in accordance with the present invention can be obtained by forming the phase shift film and light-shielding film etc. on the transparent substrate, for example, by reactive sputtering.

A method using a direct current (DC) power source or a method using a high-frequency (RF) power source can be used as the sputtering method. Further, the magnetron sputtering system or conventional system can be used.

In a case where the layer formed by sputtering includes chromium (Cr), chromium can be used as the target. Further, the sputtering gas composition can be prepared to contain components that will constitute together with Cr the layer obtained by sputtering. Likewise, in a case where the phase shift film includes, for example, molybdenum (Mo) and silicon (Si), a MoSi target including Mo and Si, or two targets, namely, a MoSi target and a Si target, are used as the target for sputtering. The sputtering gas composition can be prepared to contain components that will constitute together with Mo and Si the layer obtained by sputtering.

More specifically, in a case where a CrOC layer is formed by reactive sputtering, a gas including carbon (C) and oxygen (0) such as $CO_2$ and CO, or one or more types of gases including C of a hydrocarbon system, such as $CH_4$ and $C_3H_8$, and gases including O, such as CO2 and O2 respectively are introduced as the sputtering gas. An inert gas such as argon (Ar) and helium (He) can be added thereto. These gases may be independently introduced into the chamber, or may be mixed in advance and then introduced into the chamber.

In a case where a CrOCN layer is formed by reactive sputtering, one or more types of gases including carbon (C) and oxygen (O), such as $CO_2$ and CO, and gases including nitrogen (N), such as N2, NO, and $N_2O$ respectively, are introduced as sputtering gases, or one or more types of gases including C of a hydrocarbon system such as CH4 and $C_3H_8$, gases including O, such as $CO_2$ and O2, and gases including N, such as N2, NO, and $N_2O$ respectively, are introduced as putter gases. An inert gas such as argon (Ar) and helium (He) can be added thereto. These gases may be independently introduced into the chamber, or may be mixed in advance and then introduced into the chamber.

In a case where a CrN layer is formed by reactive sputtering, a gas including nitrogen (N), such as N2, is introduced as a sputtering gas. An inert gas such as argon (Ar) and helium (He) can be added thereto. These gases may be independently introduced into the chamber, or may be mixed in advance and then introduced into the chamber.

In a case where a CrON layer is formed by reactive sputtering, a gas including nitrogen (N) and oxygen (O), such as NO and $N_2O$, or one or more types of gases including O, such as NO and O2, and gases including N, such as N2, NO, and $N_2O$ respectively, are introduced as the sputtering gas. An inert gas such as argon (Ar) and helium (He) can be added thereto. These gases may be independently introduced into the chamber, or may be mixed in advance and then introduced into the chamber.

In a case where a CrOC layer is formed by reactive sputtering, a gas including carbon (C) and oxygen (O), such as $CO_2$ and CO, or one or more types of gases including C of a hydrocarbon system such as CH4 and $C_3H_8$, and gases including O, such as $CO_2$ and O2 respectively, are introduced as sputtering gases. An inert gas such as argon (Ar) and helium (He) can be added thereto. These gases may be independently introduced into the chamber, or may be mixed in advance and then introduced into the chamber.

In a case where a CrO layer is formed by reactive sputtering, a gas including oxygen (O), such as O2, is introduced as a sputtering gas. An inert gas such as argon (Ar) and helium (He) can be added thereto. These gases may be independently introduced into the chamber, or may be mixed in advance and then introduced into the chamber.

In a case where the layer formed by sputtering includes molybdenum (Mo) and silicon (Si), a MoSi target including Mo and Si may be used, or both the MoSi target and the Si target may be used. The composition ratio of Mo and Si in the light-shielding layer is adjusted by adjusting the content amount ratio of Mo and Si contained in the target, the sputtering surface area, and the voltage applied to the target. In a case where carbon (C) is contained in addition to Mo and Si in the light-shielding layer, $CH_4$, $C_3H_8$, CO2, and CO can be used as a sputtering gas including C, where nitrogen (N) is contained as the additional element, N2, NO, and $N_2O$ can be used as a sputtering gas including N, and where oxygen (O) is contained as the additional element, $CO_2$ and O2 can be used as a sputtering gas including O.

In a case where the layer formed by sputtering is a light-shielding layer including tantalum (Ta), a target including Ta is used in the same manner as the target used for forming the light-shielding layer including molybdenum (Mo) and silicon (Si). Sputtering gases that can be used in a case where carbon (C), oxygen (O), or nitrogen (N) etc. is contained in addition to Ta in the light-shielding layer are similar to those used to form a light-shielding layer including Mo and Si.

3. Phase Shift Mask and Manufacturing Method Therefor

A phase shift mask obtained from the phase shift mask blank in accordance with the present invention and a method for manufacturing the phase shift mask will be explained below.

A resist film is formed by coating a resist on a phase shift mask blank on which the phase shift film and light-shielding film have been formed (prior to resist coating) and drying. A suitable resist has to be selected correspondingly to the lithography device that will be used. A positive or negative resist having an aromatic skeleton in a polymer can be used for the electron beam (EB) lithography that is usually used, and it is preferred that a resist of a chemical-amplified type be used for the manufacture of a photomask for a very fine pattern for which the present invention can be used especially effectively.

The resist thickness has to be within a range in which good pattern shape can be obtained and in a range in which functions of the resist as an etching mask can be demonstrated. In particular, in a case where a fine pattern is to be formed for a mask for ArF exposure, the thickness is preferably equal to or less than 200 nm, more preferably equal to or less than 150 nm, and even more preferably equal to or less than 100 nm. In a case where a two-layer resist method using a combination of a resist including a silicon resin and a lower layer including an aromatic resin, or a surface imaging method using a combination of a chemically-amplified aromatic resist and a silicon surface treatment agent is employed, the film thickness can be further reduced. Coating conditions and drying method are appropriately selected correspondingly to the resist used.

In order to reduce the occurrence of problems associated with peeling or collapsing of the fine resist pattern, a resin layer may be formed on the surface of the phase shift mask blank before the resist is coated. Further, instead of forming the resist layer, a surface treatment may be performed to decrease the surface energy of the substrate (photomask blank) surface before the resist is coated. For example, alkyl-sillylation of the surface with HMDS (hexamethyl disilazane) that is usually used in the semiconductor fabrication process, or another silicon-containing organic surface treatment agent can be used as the surface treatment method.

Lithography of the resist in the phase shift mask blank having the resist film formed thereon is conducted by EB irradiation or light irradiation. The method based on EB irradiation it generally preferred for forming a fine pattern. In a case where a chemical-amplified resist is used, lithography is usually performed with energy within a range of 3 to 40 $p \cdot C/cm^2$, heating is treated after the lithography, and then the resist film is developed to obtain the resist pattern.

The phase shift film or the like is subjected to etching in which the resist pattern obtained in the above-described manner is used as an etching mask. Dry etching with the known chlorine system or fluorine system can be used, correspondingly to the composition of the film to be etched, as the etching method.

Where the resist is stripped with a predetermined stripping liquid after the light-shielding pattern has been obtained by etching, a photomask with the light-shielding film pattern formed thereon is obtained.

4. Pattern Transfer

The phase shift mask in accordance with the present invention is especially useful as a mask to be used in a pattern transfer method in which a fine pattern with a DRAM half-pitch (hp) of 45 nm or less in a semiconductor design rule is formed by using an exposure method with a numerical aperture NA>1 and an exposure light wavelength of equal to or less than 200 nm.

The photomask blank in accordance with the present invention is especially effective in a case where it is used for forming a resist pattern with a line width of less than 100 nm on a photomask blank. A mask having an OPC structure is an example of such a photomask blank. In the OPC mask, the width of an auxiliary pattern provided around the main pattern with the object of increasing the resolution of the main pattern is the smallest. Therefore, the photomask blank in accordance with the present invention is especially effective for pattern transfer using a photomask having these patterns.

EXAMPLES

The present invention will be described below in greater detail by using examples, but the present invention is not limited to the below-described examples.

Example 1

A phase shift mask blank of Example 1 was a halftone phase shift mask blank in which a phase shift film composed of MoSiNO and a light-shielding film were provided on a 6025 (size: 6 inch×6 inch, thickness 0.25 inch) transparent substrate composed of synthetic quartz, wherein the light-shielding film was composed of a Cr-containing material and had formed on the surface thereof a surface antireflection layer having an antireflection function that enables the suppression of reflection of light returning from the transferred substrate side, with respect to the wavelength of ArF excimer laser beam.

The phase shift film and light-shielding film in the phase shift mask blank of Example 1 were formed with a DC magnetron sputtering apparatus.

The phase shift film composed of MoSiNO was formed on the transparent substrate by reactive sputtering by using a mixed target including Mo and Si (a Mo content to a total content of Mo and Si was 4%; relative density was equal to or greater than 98%) as a sputtering target and using a mixed gas atmosphere of Ar gas, N2 gas, 02 gas, and He gas (Ar: 11.5 sccm, N2: 50 sccm, 02: 8.1 sccm, and He: 100 sccm) as a sputtering gas. After the phase shift film was formed, heating was treated for 2 hours at a temperature of 400° C. in an atmosphere including a nitrogen gas.

The obtained phase shift film had a transmittance in an ArF excimer laser (wavelength 193.4 nm) of 20.0% and a phase difference of 177.4° (measurements were conducted with a phase shift amount measurement device MPM 193 manufactured by Lasertec Corporation).

The refractive index (n) of the phase shift film was 2.32, the extinction coefficient (k) was 0.30, and the film thickness was 74 nm.

Figure 2:
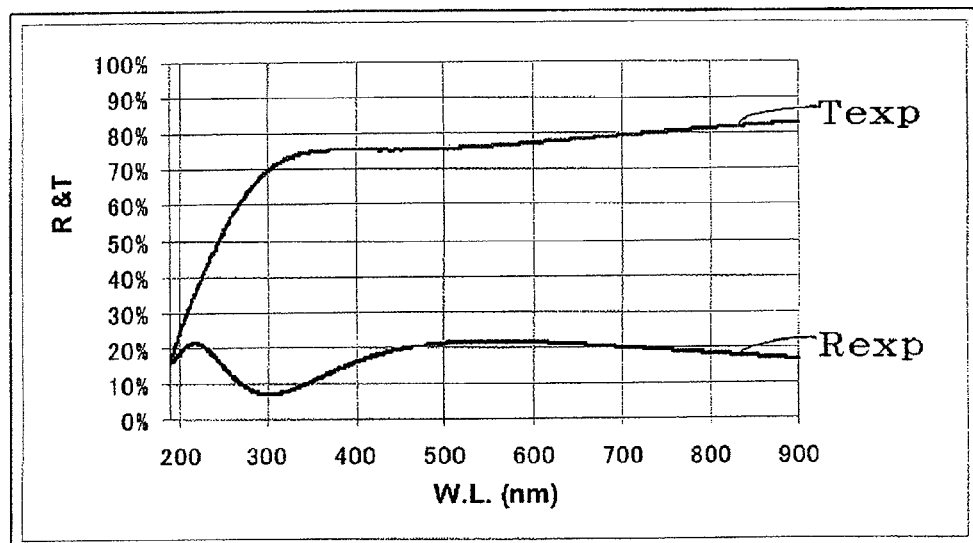
FIG. 2 is a graph illustrating the transmittance and reflectance curves of a phase shift film of Example 1.

The transmittance and reflectance characteristics of the phase shift film are shown in FIG. 2. The transmittance at 257 nm, which is an inspection light wavelength of mask defect inspection apparatus, had a good value of equal to or less than 60% that enabled sufficient inspection in a mask defect inspection apparatus. Furthermore, the reflectance at a wavelength of 678 nm of a light source that is used for the etching end point detection was equal to or greater than 20%, a sufficient difference was provided with the reflectance of the transparent substrate, and the phase shift film demonstrated good characteristic for etching end point detection.

Figure 3:
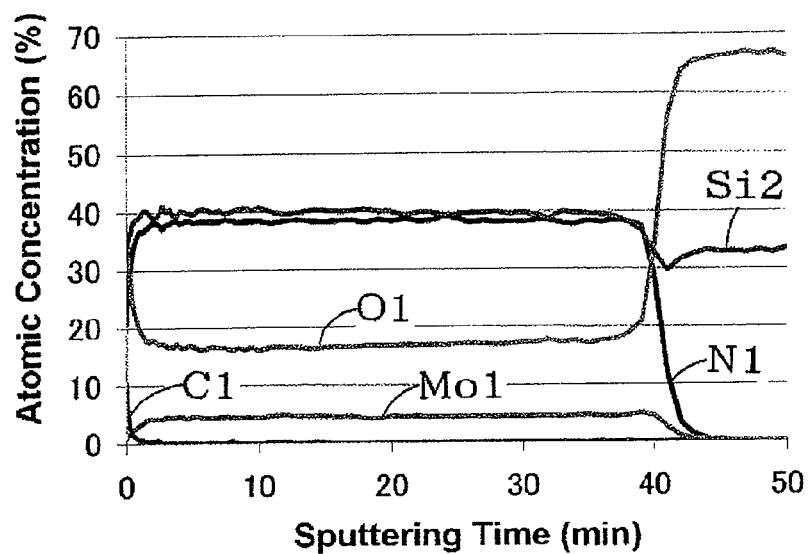
FIG. 3 is a graph illustrating the results of Auger electron spectroscopy of the phase shift film of Example 1.

The composition analysis of the phase shift film was conducted by Auger electron spectroscopy. The results are shown in FIG. 3. The average content of each element in the phase shift film was as follows: Mo: 4.6 atomic %, Si: 40.0 atomic %, N: 38.4 atomic %, 0: 16.9 atomic %, and C: 0.1 atomic %. A Mo/Mo+Si value found from the average content of the each element was 0.10. The measurement conditions in Auger electron spectroscopy were as follows: accelerating voltage 5 kV, specimen current 15 nA, beam diameter 100 nm 0, specimen inclination angle 72°, degree of vacuum during measurements (spectrum measurements) 1×10–7 Pa, and a degree of vacuum during measurements (analysis in thickness direction) $1\times10^{-5}$ Pa. Ion etching conditions: ion species Ar+, accelerating voltage 2 kV, specimen inclination angle 72°, and etching rate (calculated as $SiO_2$) 2.4 nm/min.

The composition analysis of the phase shift film was also conducted by Rutherford backscattering spectroscopy. As a result, the following average content of each element in the phase shift film were obtained: Mo: 1.8 atomic %, Si: 37.2 atomic %, N: 48.1 atomic %, 0: 12.7 atomic %, and Ar: 0.2 atomic %.

A light-shielding film having a three-layer structure composed of a lower layer, an intermediate layer, and an upper layer was formed on the phase shift film by using a sputtering apparatus similar to the DC magnetron sputtering apparatus that was used for forming the phase shift film.

The light-shielding film having the three-layer structure was formed by the following method.

First a lower layer 3 composed of CrOCN and having a thickness of 22 nm was formed on the phase shift film by reactive sputtering by using Cr as a sputtering target and a mixed gas atmosphere of Ar gas, N2 gas, $CO_2$ gas, and He gas (Ar: 18 sccm, N2: 10 SCCM, CO2: 18.8 seem, and He: 32 sccm) as a sputtering gas.

Then, an intermediate layer 2 composed of CrON and having a thickness of 20 nm was formed on the lower layer 3 by reactive sputtering by using Cr as a sputtering target and a mixed gas atmosphere of Ar gas, NO gas, and He gas (Ar: 13 sccm, NO: 11.1 sccm, and He: 32 sccm).

Then, an upper layer 1 composed of CrOCN and having a thickness of 13 nm was formed on the intermediate layer 2 by reactive sputtering by using Cr as a sputtering target and a mixed gas atmosphere of Ar gas, N2 gas, $CO_2$ gas, and He gas (Ar: 18 sccm, N2: 10 SCCM, CO2: 26.3 sccm, and He: 32 sccm). As a result, a halftone phase shift mask blank of Example 1 was obtained.

The thickness of the light-shielding film was set such (55 nm) that the optical density (OD) with respect to the wavelength of the ArF excimer laser beam was equal to or greater than 3 for the total of the phase shift film and light-shielding film. The CrOCN layer formed as a surface layer of the light-shielding film had a reflectance of 19.8% with respect to the wavelength of the ArF excimer laser beam and had an antireflection function that made it possible to suppress the reflection of light returning from the transferred substrate side.

A chemical-amplified resist film with a thickness of 150 nm (PRL009, manufactured by Fuji Film Electronics Materials Co., Ltd.) was formed by spin coating on the halftone phase shift mask blank thus obtained, and a desired pattern was obtained at the resist film by using an electron beam lithography device. Then, development was conducted with a predetermined development solution and a resist pattern having an OPC pattern with a minimum width of 50 nm was formed.

The light-shielding film was dry etched using a mixed gas of $Cl_2$ and $0_2$, the resist pattern serving as a mask, and a light-shielding film pattern was formed. The light-shielding film pattern, as a mask, was then dry etched using a mixed gas of $SF_6$+He, and a phase shift film pattern was formed. Then, a phase shift mask was obtained in which a light-shielding film pattern 10 was formed on a phase shift film pattern 20 that was formed in a transfer region such as shown in (2) of FIG. 1. The phase shift mask was a halftone phase shift mask that had no pattern defects even in the OPC pattern.

Example 2

A halftone phase shift mask blank and a halftone phase shift mask with a transmittance with respect to the ArF excimer laser beam of 14.8% were fabricated in the same manner as in Example 1, except that a mixed gas atmosphere of Ar gas, N2 gas, 02 gas, and He gas (Ar: 11 sccm, N2: 50 sccm, 02: 4.2 sccm, and He: 100 sccm) was used as a sputtering gas for forming the phase shift film in the process of the above-described Example 1.

The phase shift film had a transmittance in an ArF excimer laser (wavelength 193 nm) of 14.8% and a phase difference of 176.8° (measurements were conducted with a phase shift amount measurement device MPM193 manufactured by Lasertec Corporation).

The refractive index (n) of the phase shift film was 2.44, the extinction coefficient (k) was 0.38, and the film thickness was 68 nm.

Figure 4:
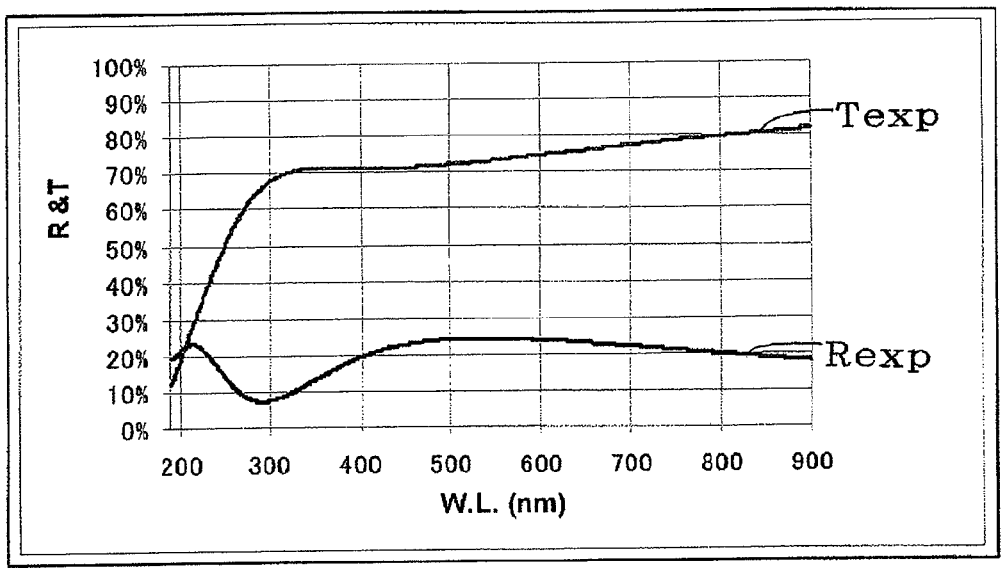
FIG. 4 is a graph illustrating the transmittance and reflectance curves of a phase shift film of Example 2.

The transmittance and reflectance characteristics of the phase shift film are shown in FIG. 4. The transmittance at 257 nm, which is an inspection light wavelength of mask defect inspection apparatus, had a good value of equal to or less than 60% that enabled sufficient inspection in a mask defect inspection apparatus. Furthermore, the reflectance at a wavelength of 678 nm of a light source that is used for the etching end point detection was equal to or greater than 20%, a sufficient difference was provided with the reflectance of the transparent substrate, and the phase shift film demonstrated good characteristic for etching end point detection.

Figure 5:
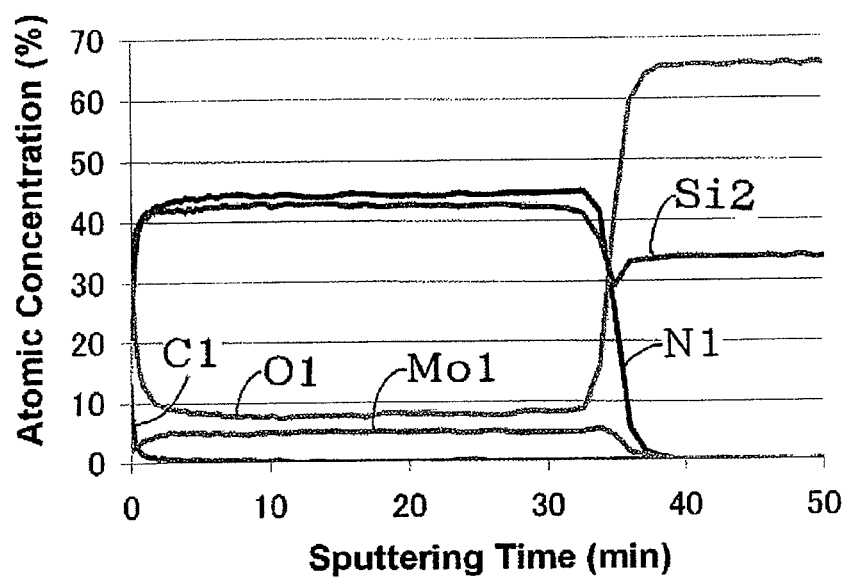
FIG. 5 is a graph illustrating the results of Auger electron spectroscopy of the phase shift film of Example 2.

The composition analysis of the phase shift film was conducted by Auger electron spectroscopy. The results are shown in FIG. 5. The average content of each element in the phase shift film was as follows: Mo: 4.9 atomic %, Si: 42.7 atomic %, N: 44.4 atomic %, 0: 7.9 atomic %, and C: 0.1 atomic %. A Mo/Mo+Si value found from the average content of the each element was 0.10.

The composition analysis of the phase shift film was also conducted by Rutherford backscattering spectroscopy. As a result, the following average content of each element in the phase shift film were obtained: Mo: 1.8 atomic %, Si: 38.0 atomic %, N 52.5 atomic %, 0: 7.5 atomic %, and Ar: 0.2 atomic %.

The thickness of the light-shielding film formed on the phase shift film was set such (52 nm) that the optical density (OD) with respect to the wavelength of the ArF excimer laser beam was equal to or greater than 3 for the total of the phase shift film and light-shielding film, in the same manner as in Example 1, except that the thickness of the intermediate layer 2 was 17 nm. The halftone phase shift mask of Example 2 also was a halftone phase shift mask that had no pattern defects in the OPC pattern.

Example 3

A halftone phase shift mask blank and a halftone phase shift mask with a transmittance with respect to the ArF excimer laser beam of 13.4% were fabricated in the same manner as in Example 2, except that the sputtering gas used for forming the phase shift film in the above-described Example 1 was changed to a mixed gas atmosphere of Ar gas, N2 gas, and He gas (Ar: 10.5 sccm, N2: 55 sccm, and He: 100 sccm) and a film for an etching mask composed of MoSiN and having a thickness of 15 nm was formed on the light-shielding film.

The phase shift film had a transmittance in an ArF excimer laser (wavelength 193 nm) of 13.4% and a phase difference of 160.0° (measurements were conducted with a phase shift amount measurement device MPM193 manufactured by Lasertec Corporation).

The refractive index (n) of the phase shift film was 2.53, the extinction coefficient (k) was 0.45, and the film thickness was 58.0 nm.

The composition analysis of the phase shift film was conducted by Auger electron spectroscopy. The results are shown in FIG. 3. The average content of each element in the phase shift film was as follows: Mo: 5.2 atomic %, Si: 44.2 atomic %, N: 49.5 atomic %, 0: 1.0 atomic %, and C: 0.1 atomic % (oxygen (0) contained in the phase shift film of Example 3 was supposedly detected because of the effect of oxide film or the like formed on the surface layer of the phase shift film) A Mo/Mo+Si value found from the average content of the each element was 0.10.

The composition analysis of the phase shift film was also conducted by Rutherford backscattering spectroscopy. As a result, the following average content of elements in the phase shift film were obtained: Mo: 1.8 atomic %, Si: 39.7 atomic %, N 58.3 atomic %, and Ar: 0.2 atomic %.

The thickness of the light-shielding film formed on the phase shift film was set such (52 nm) that the optical density (OD) with respect to the wavelength of the ArF excimer laser beam was equal to or greater than 3 for the total of the phase shift film and light-shielding film, in the same manner as in Example 1. The halftone phase shift mask of Example 3 also was a halftone phase shift mask that had no pattern defects in the OPC pattern.

Example 4

A halftone phase shift mask blank and a halftone phase shift mask were fabricated such that the lower layer 3 had a thickness of 28 nm, the intermediate layer 2 had a thickness of 7 nm, and the upper layer had a thickness of 14 nm and the thickness of the light-shielding film formed on the phase shift film in the process of Example 3 was set such (49 nm) that the optical density (OD) with respect to the wavelength of the ArF excimer laser beam was equal to or greater than 2.8 for the total of the phase shift film and light-shielding film. The halftone phase shift mask of Example 4 also was a halftone phase shift mask that had no pattern defects in the OPC pattern.

Examples 5 to 8

A halftone phase shift mask blank and a halftone phase shift mask were fabricated in the same manner as in Example 1, except that the Mo content in the sputtering target, oxygen flow rate during film formation, and film thickness were changed as shown in Table 1 so that the phase difference based on the phase shift film in the above-described process of Example 1 was 177° with respect to the wavelength of the ArF excimer laser beam. The thickness of the light-shielding film located on the phase shift film was set such that the optical density (OD) with respect to the wavelength of the ArF excimer laser beam was equal to or greater than 3 for the total of the phase shift film and light-shielding film.

TABLE 1

| | Transmittance (193.4 nm) | Target (Mo/Mo + Si) (%) | Oxygen flow rate during film formation (sccm) | Transmittance (257 nm) | Film thickness (nm) | Extinction coefficient (k) | Can the film be recognized*) |
|---|---|---|---|---|---|---|---|
| Example 5 | 10% | 4.8 | 0 | Equal to or less than 60% | 65 | 0.08 | Yellow-brown. Can be recognized. |
| Example 6 | 12% | 3.8 | 0 | Equal to or less than 60% | 64 | 0.06 | Light brown. Can be recognized |
| Example 7 | 15% | 4.0 | 8 | Equal to or less than 60% | 69 | 0.06 | Light yellow. Can be recognized. |
| Example 8 | 20% | 4.0 | 16 | Equal to or less than 60% | 73 | 0.04 | Light yellow. Can be recognized |
| Comparative Example 1 | 15% | 1.9 | 0 | More than 60% | 62 | 0.03 | Very light yellow color. Cannot be recognized |
| Comparative Example 2 | 20% | 1.4 | 8 | More than 60% | 66 | 0.02 | Almost transparent. Cannot be recognized |

*) Recognition by visual observations from the end surface of the transparent substrate.

Because the extinction coefficient (k) relating to the wavelength (400 nm) of visible light range is greater than 0.03, although the phase shift film has a high transmittance of equal to or greater than 10% and the film thickness is as small as equal to or less than 80 nm, as in the above-described Examples 5 to 8, the presence or the absence of the phase shift film can be visually confirmed from the end surface that is in an orthogonal relationship with the main surface of the transparent substrate where the phase shift film is formed. Therefore, even though the thickness of the high-transmittance phase shift film is reduced, a halftone phase shift mask blank can be produced without human errors.

By contrast, in Comparative examples 1 and 2, the extinction coefficient (k) relating to the wavelength (400 nm) of visible light range is equal to or less than 0.03. Therefore, the presence or the absence of the phase shift film cannot be visually confirmed from the end surface that is in an orthogonal relationship with the main surface of the transparent substrate where the phase shift film is formed, or such a confirmation is extremely difficult.

The molybdenum silicide sputtering target contained Mo, but no boron. As a result, an abnormal electric discharge that is an instability factor during film formation was suppressed and the production yield of 40% of halftone phase shift mask blanks with zero defects with a convexity of equal to or greater than 0.3 gm in a phase shift film in one plate was achieved.

Example 9

A halftone phase shift mask blank and halftone phase shift mask were fabricated in the same manner as in Examples 5 to 7, except that the content of boron in the sputtering target used for the formation of phase shift films in the above-described Examples 5 to 7 was set to 2×1020 atm/cm3.

As a consequence, the voltage during the electric discharge was reduced, without changing the results relating to the recognizing the presence or the absence of film from the end surface of the transparent substrate. As a consequence, the smoothness of target surface in a portion eroded by sputtering was increased and the production yield of halftone phase shift mask blanks with zero defects with a convexity of equal to or greater than 0.3 in a phase shift film in one plate was greatly increased to 80%.

Example 10

By using the phase shift masks obtained in the above-described Examples 1 to 8 and an immersion exposure device with an ArF excimer laser, the circuit pattern formed on the phase shift mask was transferred onto a resist formed on a semiconductor substrate and a semiconductor having a circuit pattern with a DRAM half-pitch of 32 nm was fabricated. As a result, it was possible to produce a defect-free good semiconductor.

INDUSTRIAL APPLICABILITY

With the present invention, the phase shift mask blank and phase shift mask can be used, for example, for the manufacture of semiconductors and liquid crystal panels.

DESCRIPTION OF SYMBOLS

1: light-shielding film
2: phase shift film
3: transparent substrate
10: light-shielding film pattern
20: phase shift film pattern

What is claimed is:

1. A phase shift mask blank that is an original plate for a phase shift mask that is used with a semiconductor design rule of 32 nm node and beyond and exposed by an ArF excimer laser beam, comprising:
   a transparent substrate; and
   a phase shift film including, as main components, a metal, silicon (Si) and nitrogen (N), on the transparent substrate; wherein
   a thickness of the phase shift film is equal to or less than 80 nm,
   the phase shift film has optical characteristics of a transmittance of equal to or greater than 9% and equal to or less than 30% with respect to a wavelength of the ArF excimer laser beam and a phase difference of equal to or greater than 150° and less than 180°, and
   an extinction coefficient (k) of the phase shift film with respect to light with a wavelength of 400 nm is greater than 0.03.

2. The phase shift mask blank according to claim 1, wherein the extinction coefficient (k) of the phase shift film with respect to light with a wavelength of 400 nm be equal to or greater than 0.04.

3. The phase shift mask blank according to claim 1, wherein in the phase shift film, a value (A) of (atomic concentration of the metal)/(atomic concentration of the metal+atomic concentration of silicon (Si)) that is calculated from measurement results based on Auger electron spectroscopy is 0.06 to 0.13 and the content of N is equal to or greater than 35 atomic % and equal to or less than 55 atomic %.

4. The phase shift mask blank according to claim 1, wherein a value (R) of (atomic concentration of the metal)/(atomic concentration of the metal+atomic concentration of silicon (Si)) that is calculated from measurement results based on Rutherford Backscattering Spectrometry is preferably 0.01 to 0.08 and the content of nitrogen (N) is preferably equal to or greater than 45 atomic % and equal to or less than 65 atomic %.

5. The phase shift mask blank according to claim 1, wherein the metal of the phase shift film include at least one element selected from molybdenum (Mo), tantalum (Ta), zirconium (Zr) and tungsten (W).

6. The phase shift mask blank according to claim 1, wherein the phase shift film is made of MoSi, MoSiO, MoSiN, MoSiON, MoSiCO, MoSiCN or MoSiCON.

7. The phase shift mask blank according to claim 1, wherein a thickness of the phase shift film is equal to or less than 70 nm.

8. The phase shift mask blank according to claim 1, further comprising a light-shielding film that is formed on the phase shift film.

9. The phase shift mask blank according to claim 8, wherein the light-shielding film includes CrO, CrON, CrOC, CrN, CrC, or CrOCN.

10. The phase shift mask blank according to claim 8, wherein the light-shielding film has a laminated structure including a light-shielding layer and a surface antireflection layer in this order from the phase shift film side and has a film thickness such that an optical density with respect to the wavelength of the ArF excimer laser beam produced by the phase shift film and the light-shielding film is equal to or greater than 2.8.

11. The phase shift mask blank according to claim 8, wherein the thickness of the light-shielding film is equal to or less than 60 nm.

12. The phase shift mask blank according to claim 8, further comprising a resist film that is formed on the light-shielding film.

13. A phase shift mask, wherein a phase shift film pattern is formed by patterning the phase shift film in the phase shift mask blank according to claim 1.

14. A method for manufacturing a semiconductor device, comprising:
   transferring a circuit pattern formed in the phase shift mask according to claim 10 on a resist formed on a semiconductor substrate by using photolithography technology, to manufacture a semiconductor device.

* * * * *